United States Patent
Sheynikhovich et al.

(10) Patent No.: US 12,198,573 B2
(45) Date of Patent: Jan. 14, 2025

(54) DEVICE FOR SIMULATING A PHYSIOLOGICAL BEHAVIOUR OF A MAMMAL USING A VIRTUAL MAMMAL, PROCESS AND COMPUTER PROGRAM

(71) Applicants: Essilor International, Charenton-le-Pont (FR); Sorbonne Université, Paris (FR)

(72) Inventors: Denis Sheynikhovich, Paris (FR); Richard Carrillo, Granada (ES); Luca Leonardo Bologna, Paris (FR); Youssouf Cherifi, Noisy-le-Sec (FR); Tianyi Li, Paris (FR); Angelo Arleo, Paris (FR); Konogan Baranton, Charenton-le-Pont (FR); Anne-Catherine Scherlen, Charenton-le-Pont (FR); Delphine Tranvouez-Bernardin, Saint-Laurent (CA)

(73) Assignees: Essilor International, Charenton-le-Pont (FR); Sorbonne Université, Paris (FR)

( * ) Notice: Subject to any disclaimer, the term of this patent is extended or adjusted under 35 U.S.C. 154(b) by 239 days.

(21) Appl. No.: 17/441,564

(22) PCT Filed: Mar. 20, 2020

(86) PCT No.: PCT/EP2020/057888
§ 371 (c)(1),
(2) Date: Sep. 21, 2021

(87) PCT Pub. No.: WO2020/193439
PCT Pub. Date: Oct. 1, 2020

(65) Prior Publication Data
US 2022/0198959 A1    Jun. 23, 2022

(30) Foreign Application Priority Data
Mar. 22, 2019 (EP) .................................... 19305363

(51) Int. Cl.
G09B 23/32    (2006.01)
G06F 30/27    (2020.01)
G09B 23/30    (2006.01)

(52) U.S. Cl.
CPC ............. *G09B 23/32* (2013.01); *G06F 30/27* (2020.01); *G09B 23/30* (2013.01)

(58) Field of Classification Search
CPC .......... G09B 23/32; G09B 23/30; G06F 30/27
See application file for complete search history.

(56) References Cited

U.S. PATENT DOCUMENTS 5,774,591 A * 6/1998 Black ................... G06V 40/165
                                                        382/118
9,381,426 B1 * 7/2016 Hughes .................. H04L 67/06
(Continued)

FOREIGN PATENT DOCUMENTS

CA    2 925 703 A1    6/2016
CN    1465042 A      12/2003
(Continued)

OTHER PUBLICATIONS

International Search Report issued on May 4, 2020 in PCT/EP2020/057888 filed Mar. 20, 2020, 2 pages.
(Continued)

*Primary Examiner* — Jack Yip
(74) *Attorney, Agent, or Firm* — Oblon, McClelland, Maier & Neustadt, L.L.P.

(57) ABSTRACT

A device for simulating a behavior of a mammal in an environment by a virtual mammal includes a mobile head and at least one mobile eye including a first input for successive data representative of eye poses, a second input
(Continued)

Figure 1:
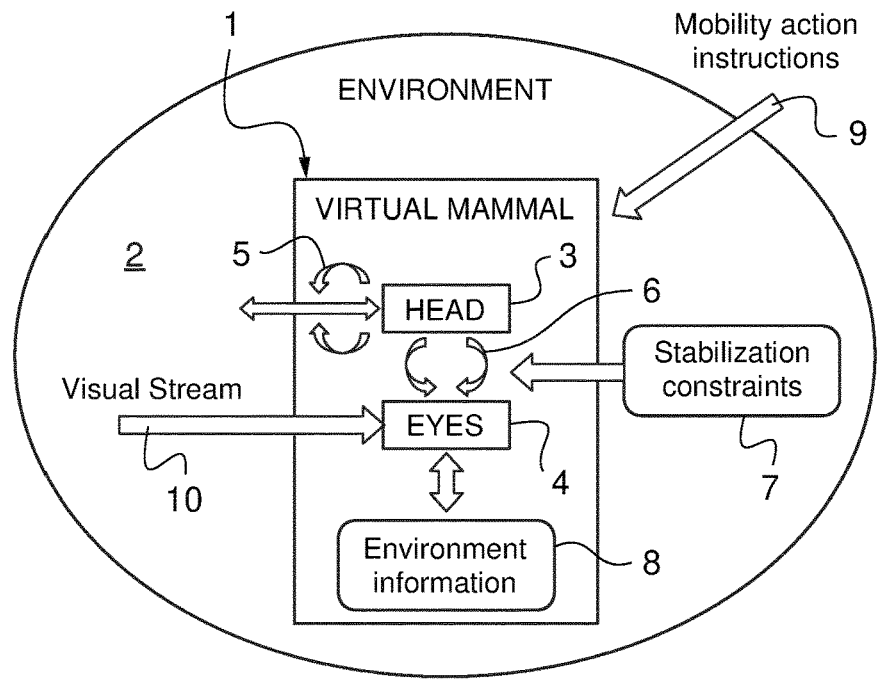

for mobility action instructions, a memory for storing information on the environment and on stabilization constraints, at least one processor assessing a current part of the environment and recording information on said current part, triggering successive movements of the head and of the eye(s) in function of said mobility action, controlling a dynamic adjustment of the successive movements of the eye(s) with respect to the successive movements of the head in function of the successive data and by using the stabilization constraints. The device further comprises a third input for training data representative of a training movement sequence of the head and the eye(s) associated with a training environment.

12 Claims, 5 Drawing Sheets

(56) References Cited

U.S. PATENT DOCUMENTS

| | | | | |
|---|---|---|---|---|
| 9,786,084 | B1* | 10/2017 | Bhat | G06T 15/04 |
| 10,065,074 | B1* | 9/2018 | Hoang | G01P 1/02 |
| 10,949,648 | B1* | 3/2021 | Cao | G06V 40/161 |
| 2005/0021483 | A1* | 1/2005 | Kaplan | G06N 3/004 |
| | | | | 706/12 |
| 2008/0025569 | A1* | 1/2008 | Gordon | G06V 40/161 |
| | | | | 382/103 |
| 2010/0045680 | A1* | 2/2010 | Havaldar | G06T 13/40 |
| | | | | 345/473 |
| 2010/0106295 | A1* | 4/2010 | Cho | H04N 23/68 |
| | | | | 700/245 |
| 2011/0052081 | A1* | 3/2011 | Onoe | G06T 11/00 |
| | | | | 382/203 |
| 2011/0110561 | A1* | 5/2011 | Havaldar | G06T 7/251 |
| | | | | 382/103 |
| 2013/0211238 | A1* | 8/2013 | DeCharms | A61B 5/4848 |
| | | | | 600/407 |
| 2014/0315174 | A1* | 10/2014 | Sassani | G09B 23/285 |
| | | | | 434/262 |
| 2017/0011745 | A1* | 1/2017 | Navaratnam | H04N 7/157 |
| 2017/0091529 | A1* | 3/2017 | Beeler | G06T 7/246 |
| 2017/0091994 | A1* | 3/2017 | Beeler | G06T 7/11 |
| 2017/0132827 | A1* | 5/2017 | Tena | G06T 17/20 |
| 2017/0263017 | A1* | 9/2017 | Wang | G06V 40/193 |
| 2018/0000339 | A1 | 1/2018 | Hipsley | |
| 2018/0089553 | A1* | 3/2018 | Liu | G06N 3/008 |
| 2019/0122411 | A1* | 4/2019 | Sachs | G06T 7/90 |
| 2020/0066391 | A1* | 2/2020 | Sachdeva | G16H 20/40 |

FOREIGN PATENT DOCUMENTS

| | | |
|---|---|---|
| CN | 102834854 A | 12/2012 |
| CN | 108090247 A | 5/2018 |
| EP | 0 831 444 A1 | 3/1998 |
| EP | 1 862 110 A1 | 12/2007 |
| ES | 2 129 399 T3 | 6/1999 |
| JP | 2006-065094 A | 3/2006 |
| WO | WO 2017/157760 A1 | 9/2017 |
| WO | WO 2018/005891 A2 | 1/2018 |

OTHER PUBLICATIONS

Naveros, F., et al., "Exploring vestibule-ocular adaption in a closed-loop neuro-robotic experiment using STDP. A simulation study", IEEE/RSJ International Conf. on Intelligent Robots and Systems (IROS), 2018, 6 total pages.

Crane, B., et al., "Effect of Adaption to Telescopic Spectacles on the Initial Human Horizontal Vestibulo-ocular Reflex", IOVS, 1989, pp. 38-49.

Combined Chinese Office Action and Search Report issued Nov. 25, 2022 in Patent Application No. 202080022554.5 (with English language translation), 11 pages.

He Huang, et al.; "Visual Binocular Movement System with Physiologic Experiment"; Proceeding of the 26th JSST Annual Conference, Japan Society for Simulation Technology, Jun. 21, 2007, pp. 243-246; w/English Abstract. (5 pages).

Shin Ishii; "Simulation of Neural Systems Based on Supercomputer"; Journal of the Japanese Society for Artificial Intelligence, The Japanese Society for Artificial Intelligence, Sep. 1, 2015, vol. 30, No. 5, pp. 616-622. (8 pages).

Office Action dated Nov. 6, 2023, issued in counterpart JP Application No. 2021-556801 filed on Mar. 20, 2020, with English Translation. (9 pages).

Vannucci, L. et al.: "A comprehensive gaze stabilization controller based on cerebellar internal models", Bioinspiration & Biomimetics, Institute of Physics Publishing, Bristol, GB, vol. 12, No. 6, Oct. 6, 2017 (Oct. 6, 2017), 65001, XP020322225, ISSN: 1748-3190, DOI: 10.1088/1748-3190/AA8581, pp. 1-14, cited in EP Office Action dated Jul. 18, 2024. (14 pages).

* cited by examiner

DEVICE FOR SIMULATING A PHYSIOLOGICAL BEHAVIOUR OF A MAMMAL USING A VIRTUAL MAMMAL, PROCESS AND COMPUTER PROGRAM

TECHNICAL FIELD OF THE INVENTION

The invention relates to a device for simulating a physiological behaviour of a mammal using a virtual mammal and more precisely a behaviour in relation to the vision system of the mammal put in an environment. The invention can be implemented in the computing field and has many applications, for example in the ophthalmic domain for the assessment of a visual correction or the testing of ophthalmic products.

BACKGROUND INFORMATION AND PRIOR ART

Numerous studies have been done on the vision system of creatures, notably mammals and generally humans in the mammals, from the structure and the operation of the eyes, the light conversion, to the neurological structures and operations in relation to the vision. Based on such knowledge and also on the behaviour of the vision system, simulation models have been implemented with computers. Tools (e.g. CarlSim), application blocs (e.g. body avatar with software from www.makehumancommunity.org) or even more global application systems combining the blocs have been proposed to simulate the behaviour of creatures in the field of robotics but this is generally rather limited notably as regards the structures that are simulated and the environment they are made for.

Besides, with humans, the vision system is generally assessed with much constrained conditions regarding the images provided to the vision system, notably with fixed images and with a head and eyes not moving. Such conditions could be designated as static or quasi static conditions.

Now, the vision system is in practical subjected to a much varying visual environment and any efficient assessment of the visual performance should consider such a varying environment. For example, document EP 1 862 110 A1, describes a method to determine or select, objectively or subjectively, a visual equipment, notably lenses, where the visual equipment, the visual environment and the wearer can be virtually simulated. The importance of considering the dynamic of the vision, notably through varying visual environment and the mobility of the head and the eyes can be further emphasized on the fact that such variations and mobility are essential in the development period of the visual system of living creatures for producing a vision system that functions correctly.

Moreover, as regards the movements of the eyes, two main sources can be considered, the reflex movements and the other movements as opposed to the reflex ones. Those other movements could be named voluntary movements as opposed to reflex movements. In particular, when the head is moving, the vision system reacts to the detection by the vestibular system of a movement of the head with a reflex response that also depends on the presently visualized environment. This is called the vestibulo-ocular reflex, VOR, and it allows a stabilization of the images on the retina during head rotations by contralateral eye movements that maintain the image in the center of the visual field. The VOR is mediated by a brain area in which adaptation is directly driven by sensorimotor errors: the cerebellum. The cerebellum adaptation process, driven by an error signal in the fixation signalled by retinal slips, minimizes the retinal slips sculpting the vestibular output for generating the compensatory motor commands, which ultimately drive the eye movement. The vestibulo-ocular reflex is operational whatever the vision conditions and it works both in light and darkness conditions. The vestibulo-ocular reflex has been the subject of a Conference and related paper: "Exploring vestibulo-ocular adaptation in a closed-loop neuro-robotic experiment using STDP. A simulation study" Francisco Naveros and al., 2018 IEEE/RSJ International Conf. on Intelligent Robots and Systems (IROS), 10.1109/IROS.2018.8594019.

Such advanced works on the vision system prove anyway complex to integrate in a satisfying way into realistic implementations of robots or digital avatars moving in given environments. Namely, the existing simulation systems usually either fall short of realistic enough vision mechanisms, or prove to generate more or less substantial distortions with respect to real-world mammals.

Document WO2018/005891 A2 is also known.

SUMMARY OF THE INVENTION

One object of the invention is to provide a device for simulating a physiological behaviour of a mammal in an environment by a virtual mammal, said virtual mammal including:
- a head mobile with respect to the environment,
- at least one eye rotationally mobile with respect to the head, said device comprising:
- at least one first input adapted to receive successive data representative of poses of said at least one eye with respect to the environment,
- at least one second input adapted to receive instructions for at least one mobility action by the virtual mammal in the environment,
- at least one memory adapted to store information on the environment and on stabilization constraints between movements of said at least one eye and movements of the head,
- at least one processor configured for:
- assessing a current part of the environment from said successive data, and recording information on said current part into said at least one memory if said current part is unidentified in said at least one memory,
- triggering successive movements of the head and of said at least one eye in function of said at least one mobility action, of said successive data and of the stored information on the environment,
- controlling a dynamic adjustment of the successive movements of said at least one eye with respect to the successive movements of the head in function of said successive data, by using the stabilization constraints,
said device further comprising:
- at least one third input adapted to receive in a training stage training movement sequence data (=training data) representative of a training movement sequence of the head and of said at least one eye associated with a training environment,
- and said at least one processor being configured for learning in said training stage at least part of said stabilization constraints through:
- triggering in the training environment successive movements of the head corresponding to said training movement sequence data,
- assessing a current part of the training environment from said training data, and recording information on said current part into said at least one memory if said current part is unidentified in said at least one memory, determining information on said at least part of the stabilization constraints in function of said training data and of said successive movements of the head, taking account of assessing said current part of the training environment and of recording said information on said current part, and recording said information on said at least part of the stabilization constraints into said at least one memory, so that the virtual mammal provides a simulated behaviour of the mammal to be simulated in executing said at least one mobility action in the environment, through the successive dynamically adjusted current movements of the head and of said at least one eye and through assessing the environment.

In particular implementations, such a device can behave more or less the same as a real creature, in this instance a mammal, which can enable to simulate correctly such a mammal with a virtual mammal or, equivalently, an avatar of the mammal. In this respect, such a virtual mammal can notably allow personalized simulation, monitoring and prediction.

In some implementation modes of the disclosure, this is obtained even more identically/precisely with such a device learning to behave the same as a real mammal through a deep learning process. The latter can have the advantage over other ways of manufacturing such a virtual mammal that it does not require the creation of a complete and precise working model of the vision system or a precise knowledge of the structures and functions involved in the real vision system. This deep learning process is done advantageously with neural networks that are used to simulate at least a part of the vision system and once the neural network is trained, it can be used for the simulation.

At any rate, the device of the disclosure is not restricted to neuronal aspects of the creature and visual aspects such as eye performance, light conversion performance can also be considered in their own, or through more general conditions such as the age, degeneration or other physiological conditions.

Beside other applications, the virtual mammal simulated by the device of the disclosure can also be used as a dummy for training eye doctors, surgeons or other persons involved in ophthalmic or visual equipment.

In addition, the control of the dynamic adjustment of the eye movements is not restricted to VOR mechanisms. It can in particular encompass, instead or in combination, stabilization in intentional eye fixation and/or reflex optokinetic (in following a moving object).

In the training stage, the learning of at least part of the stabilization constraints can notably rely on implicit relationships between the received training data representative, on one hand, of movements of the head, and on the other hand, of movements of the eye(s), those relationships depending on the stabilization constraints. The processor(s) can notably take account of an underlying stabilization mechanism of images corresponding to at least one visual stream as seen by the mammal in the environment.

For example, in the training stage, at least part of the head movements and of such images are mimicked for the virtual mammal in the environment from the received training data. The latter can e.g. include data pertaining directly to such (a) visual stream(s), or data pertaining to eye movements from which such (a) visual stream(s) is (are) induced. In this example, it is not necessary to trigger eye movements in learning the stabilization constraints.

In another example, in the training stage, at least part of the head movements and of the eye movements are mimicked for the virtual mammal in the environment from the receiving training data. Such (a) visual stream(s) is (are) then induced from that simulation.

Also, in the training stage of the virtual mammal, the environment recognition can be taken into account in the learning of the at least part of the stabilization constraints, which makes possible to reflect the effective coupling between environment recognition and eye movement stabilization mechanisms proper to the mammal.

In fact, the device of the disclosure can potentially gain substantial realism in encompassing combined environment recognition and eye movement stabilization mechanisms, including in a learning stage. This enhancement can prove particularly significant for the simulation of the vision system.

The data representative of poses of the eye(s) and/or the training movement sequence data representative of a training movement sequence of the eye(s) can notably include data directed to eye poses and/or to one or more visual stream(s) corresponding to the eye poses. Such a visual stream can indeed be possibly representative of eye poses or of an eye training movement sequence.

In advantageous implementations, the virtual mammal includes a body mobile with respect to the environment, and not only a mobile head.

The following characteristics that can be optionally used with the device of the invention, alone or according to any technical combination of the following characteristics are also considered:

the processor comprises software and computation hardware, the training movement sequence of the head and of said at least one eye is obtained on the mammal to be simulated, the training movement sequence of the head and of said at least one eye is obtained by a computation and is synthetic, the learning process in the training stage is executed in a data-driven regime of the device, the device can be used in a data-driven regime in which the training stage can be executed, the device can be used in a model-driven regime, instead of recording information on said current part of the environment into said at least one memory if said current part is unidentified in said at least one memory, the at least one processor is configured for replacing previous recorded information with information on said current part into said at least one memory, the recorded information on said current part of the environment into said at least one memory is erasable, the device is also for simulating a pathological behaviour, the virtual mammal of the device is fully virtual, the virtual mammal of the device comprises material parts, the material parts include a head, the material parts include at least one eye, the material parts include a body, the material parts include a limb, the head of the device is virtual, the head of the device is a material element, the at least one eye of the device is virtual, the at least one eye of the device is a material element, the at least one eye of the device is vision capable, the at least one eye of the device comprises a camera, the instruction(s) for at least one mobility action include(s) an instruction for moving the head, the instruction(s) for at least one mobility action include(s) an instruction for moving the eye, the instruction(s) for at least one mobility action include(s) an instruction for moving both the head and the eye, the instruction(s) for at least one mobility action includes an instruction for looking for an object, the instruction(s) for at least one mobility action includes an instruction for going to a given place in the environment, a "pose" of the said at least one eye means a position together with an orientation with respect to a coordinate system of the said at least one eye, a "pose" of the said at least one eye can be expressed as a position and a direction values, a "pose" of the said at least one eye can be expressed as a vector, the movement sequence of the head and of said at least one eye amounts to successive poses over time, the data representative of the poses (position +orientation) pertain to the eye poses themselves, or to a visual stream corresponding to the eye poses with respect to the environment, the stabilization constraints are related to the vestibulo-ocular reflex, the stabilization constraints are related to the intentional eye fixation, the stabilization constraints are related to the optokinetic reflex, the configuration for learning of the said at least one processor is a configuration for executing a deep learning process with the data representative of a training movement sequence of the head and of said at least one eye associated with a training environment in order to learn at least part of said stabilization constraints, the mammal is a human, the mammal is a beast, the mammal that is simulated is a defined real individual, the mammal that is simulated is a theoretical mammal, the theoretical mammal is a mammal representative of a group, the theoretical mammal is statistically defined, the theoretical mammal is a study mammal, during the training stage, the training environment in which the virtual mammal is located is preferably the same as the environment in which the training movement sequence of the head and of said at least one eye of the mammal to be simulated is obtained, during the training stage, the training environment in which the virtual mammal is located is not the same as the environment in which the training movement sequence of the head and of said at least one eye of the mammal to be simulated is obtained, once the virtual mammal has been trained in the training stage, the acquired environment information/knowledge of the training environment is kept for further use of the virtual mammal, once the virtual mammal has been trained in the training stage, the acquired environment information/knowledge of the training environment is erased, so that the thus configured virtual mammal starts to discover the environment from scratch, the environment of the virtual mammal is real, the environment of the virtual mammal is virtual, for the assessment of a current part of the environment from said training data and the recording information on said current part into said at least one memory if said current part is unidentified in said at least one memory, it can be considered also as a training of the virtual mammal device but this training can be executed in both data-driven regime and model-driven regime, at least one operation among: assessing said current part of the environment, recording said information and triggering said successive movements is associated with at least one working parameter proper to said mammal to simulate, said at least one processor is further configured for learning in the training stage said at least one working parameter in function of said training data and of said successive movements of the head, taking account of assessing said current part of the training environment and of recording said information on said current part, the working parameter is selected from any kind of parameter that can be measurable or induced from external properties, the working parameter is for example related to the action of the eyelid on the level of light and scope of vision, the working parameter is for example related to the level of ambient light in the environment, said at least one processor is further configured for:

obtaining at least one visual stream corresponding to said successive data representative of poses of said at least one eye, assessing said current part of the environment from said at least one visual stream, and triggering said successive movements and controlling said dynamic adjustment in function notably of said at least one visual stream;

in said training stage, obtaining at least one training visual stream corresponding to said training movement sequence data representative of the training movement sequence, and assessing said current part of the training environment and determining said information in function notably of said at least one training visual stream, the said data representative of the training movement sequence includes positions of parts of the virtual mammal (such as e.g. a torso and/or feet of the virtual mammal) and gaze directions data over time, the said at least one processor is further configured for pre-conditioning said obtained at least one visual stream and said at least one training visual stream, in association with at least one pre-conditioning parameter proper to said mammal to simulate, and said at least one processor is further configured for learning in the training stage said at least one pre-conditioning parameter in function of said at least one training visual stream and of said successive movements of the head, taking account of the assessing of said current part of the training environment and of the recording of said information on said current part, the said at least one processor is further configured for:

deriving successive images from said at least one visual stream and controlling said dynamic adjustment by stabilizing at least part of said derived successive images, the said at least one processor is further configured for controlling said dynamic adjustment by curbing the successive movements of said at least one eye with respect to said at least part of said successive images, the device comprises at least one fifth input adapted to receive information on modified values of the stabilization constraints, said at least one processor being configured for replacing the information regarding previous values of the stabilization constraints in the memory with the information regarding said modified values, the said previous and modified values of the stabilization constraints correspond to at least one of a pair of distinct mammal ages and a pair of distinct health states, the said at least one processor comprises at least one first neural network configured for controlling said dynamic adjustment through a feedback loop, the at least one first neural network configured for controlling said dynamic adjustment through a feedback loop is build based on the cerebellar vestibulo-ocular reflex control structure of the mammal to simulate, the at least one first neural network is a simulated neural network, the at least one operation among assessing said current part of the environment, recording said information, triggering said successive movements and controlling said dynamic adjustment is associated with working parameters and said device comprises at least one input adapted to receive reference movement data corresponding to said successive movements of the head and of said at least one eye, said reference movement data being associated with reference visual data corresponding to said received at least one visual stream, and said at least one processor is configured for learning at least one of said working parameters from at least part of said reference movement data and of said reference visual data, when the virtual mammal device is learning at least one of said working parameters from at least part of said reference movement data and of said reference visual data, it is in the data-driven regime, when the virtual mammal device has finished learning at least one of said working parameters from at least part of said reference movement data and of said reference visual data, it is in the data-driven regime, it is put in the model-driven regime, the at least one visual stream of the reference visual data is synthetic, the at least one visual stream of the reference visual data is obtained on the mammal to be simulated, the at least one visual stream of the reference visual data is derived from reference gaze directions obtained on the mammal to be simulated, the at least one visual stream of the reference visual data is obtained from a camera arranged close to the eye of the mammal to be simulated, the said at least one processor comprises at least one second neural network configured for assessing said current part of the environment and recording the information on said current part, the at least one second neural network configured for assessing said current part of the environment and recording the information on said current part is build based on the Hippocampus structure of the mammal to simulate, said Hippocampus structure comprising location encoding, the at least one second neural network is a simulated neural network, the said at least one processor is configured for carrying out at least one operation among: assessing said current part of the environment, recording said information on said current part, and controlling the dynamic adjustment of the successive movements of said at least one eye, by means of simulated spiking neurons, the said device comprises at least one fourth input adapted to receive at least one simulated visual property, and said at least one processor is further configured for dynamically pre-conditioning said at least one visual stream in function of said at least one simulated visual property, the said at least one processor is further configured for dynamically pre-conditioning said at least one visual stream in function of said at least one simulated visual property thanks to at least a dedicated neural network simulating a retina and an early visual cortex of the mammal to simulate, the dedicated neural network simulating a retina and an early visual cortex is a simulated neural network, the said at least one processor is further configured for dynamically pre-conditioning said at least one visual stream in function of said at least one simulated visual property thanks to at least one customizable spatio-temporal filter filtering the at least one visual stream, the said at least one processor is further configured for dynamically pre-conditioning said at least one visual stream in function of said at least one simulated visual property thanks to a set of cascaded customizable spatio-temporal filters, the customizable spatio-temporal filter is simulating a visual equipment, in the case the eye of the virtual mammal is a material element with a camera, the visual equipment that is also material is arranged on the material eye of the virtual mammal, the customizable spatio-temporal filter is simulating a deformation of the eye, and notably a deformation of the optical interfaces of the eye, the customizable spatio-temporal filter is simulating a disease of the eye, the said at least one simulated visual property is at least partly pertaining to at least a physiological behaviour associated with said at least one eye, the physiological behaviour pertains to the eye itself or to a corresponding function in the visual cortex, the said at least one simulated visual property is at least partly pertaining to a visual equipment of said at least one eye.

A further object of the invention is to provide a process for simulating in a device according to the invention a physiological behaviour of a mammal in an environment by a virtual mammal, said virtual mammal being implemented to include:

a head rendered mobile with respect to the environment,
at least one eye rendered rotationally mobile with respect to the head, said process comprising:

receiving successive data representative of poses of said at least one eye with respect to the environment, receiving instructions for at least one mobility action by the virtual mammal in the environment, assessing by at least one processor a current part of the environment from said successive data using information on the environment stored in at least one memory, and recording information on said current part into said at least one memory if said current part is unidentified in said at least one memory, triggering by said at least one processor successive movements of the head and of said at least one eye in function of said at least one mobility action, of said successive data and of the stored information on the environment, controlling by said at least one processor a dynamic adjustment of the successive movements of said at least one eye with respect to the successive movements of the head in function of said successive data, by using stabilization constraints between movements of said at least one eye and movements of the head, said process further comprising:

receiving in a training stage training data representative of a training movement sequence of the head and of said at least one eye associated with a training environment, and learning by said at least one processor in said training stage at least part of said stabilization constraints through:

triggering in the training environment successive movements of the head corresponding to said training movement sequence, assessing a current part of the training environment from said training data, and recording information on said current part into said at least one memory if said current part is unidentified in said at least one memory, determining information on said at least part of the stabilization constraints in function of said training data and of said successive movements of the head, taking account of assessing said current part of the training environment and of recording said information on said current part, and recording said information on said at least part of the stabilization constraints into said at least one memory, so that the virtual mammal provides a simulated behaviour of the mammal to be simulated in executing said at least one mobility action in the environment, through the successive dynamically adjusted current movements of the head and of said at least one eye and through assessing the environment.

The process can be executed according to all described ways, notably for the above device, and possibly combined together.

The invention is also related to a computer program comprising instructions which, when the program is executed by a processor, causes said processor to carry out the process of the invention.

The computer program is advantageously configured for executing, separately or in combination, any of the execution modes of the process of the disclosure.

The invention is also related to a non-transitory computer-readable medium comprising the instructions of the computer program which, when executed by the at least one processor, causes said at least one processor in the device to carry out the process of the invention.

DETAILED DESCRIPTION OF EXAMPLE(S)

Figure 2:
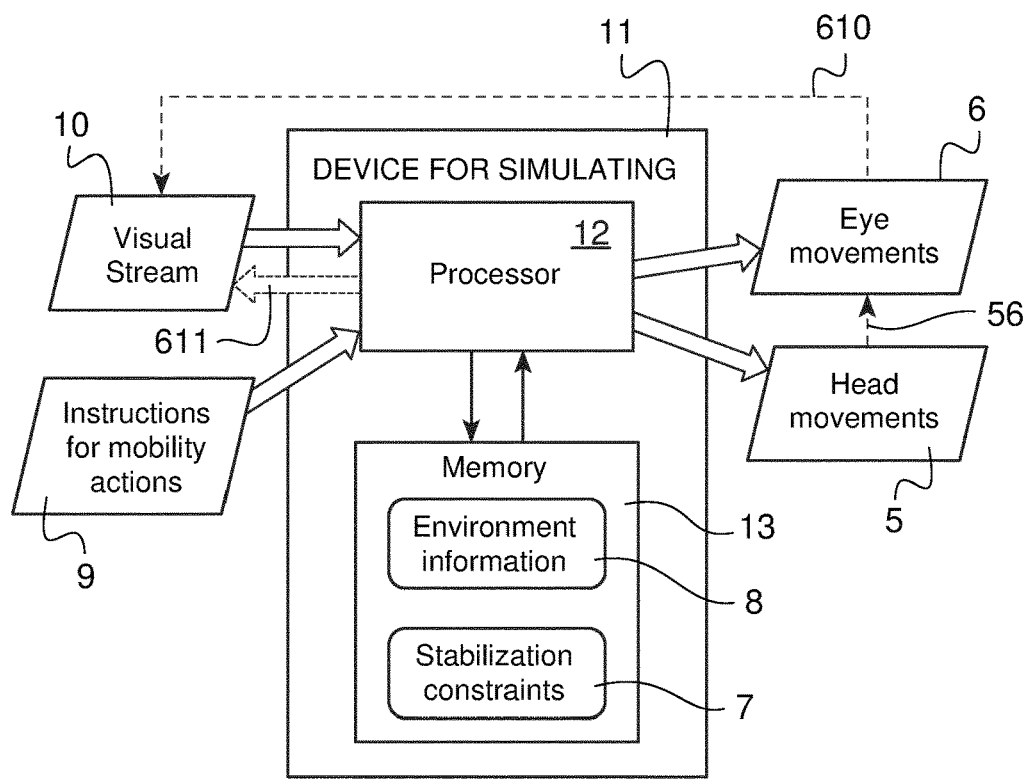
Figure 3:
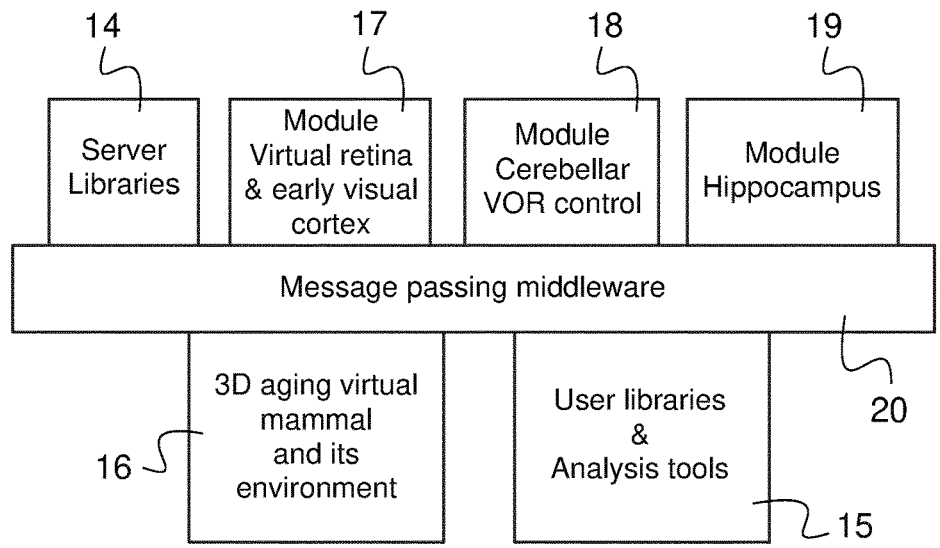
Figure 4:
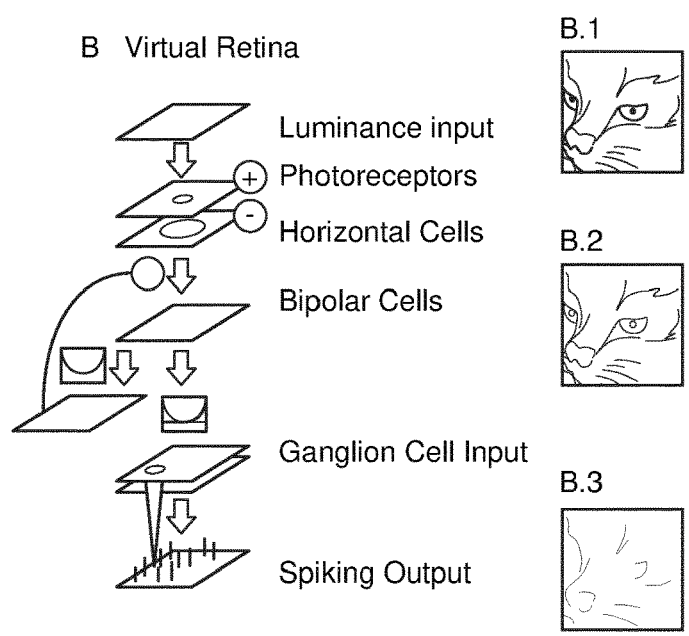
Figure 5A:
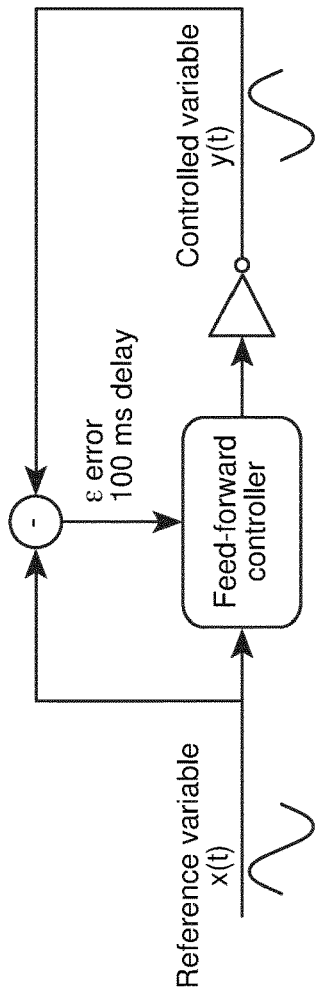
Figure 5B:
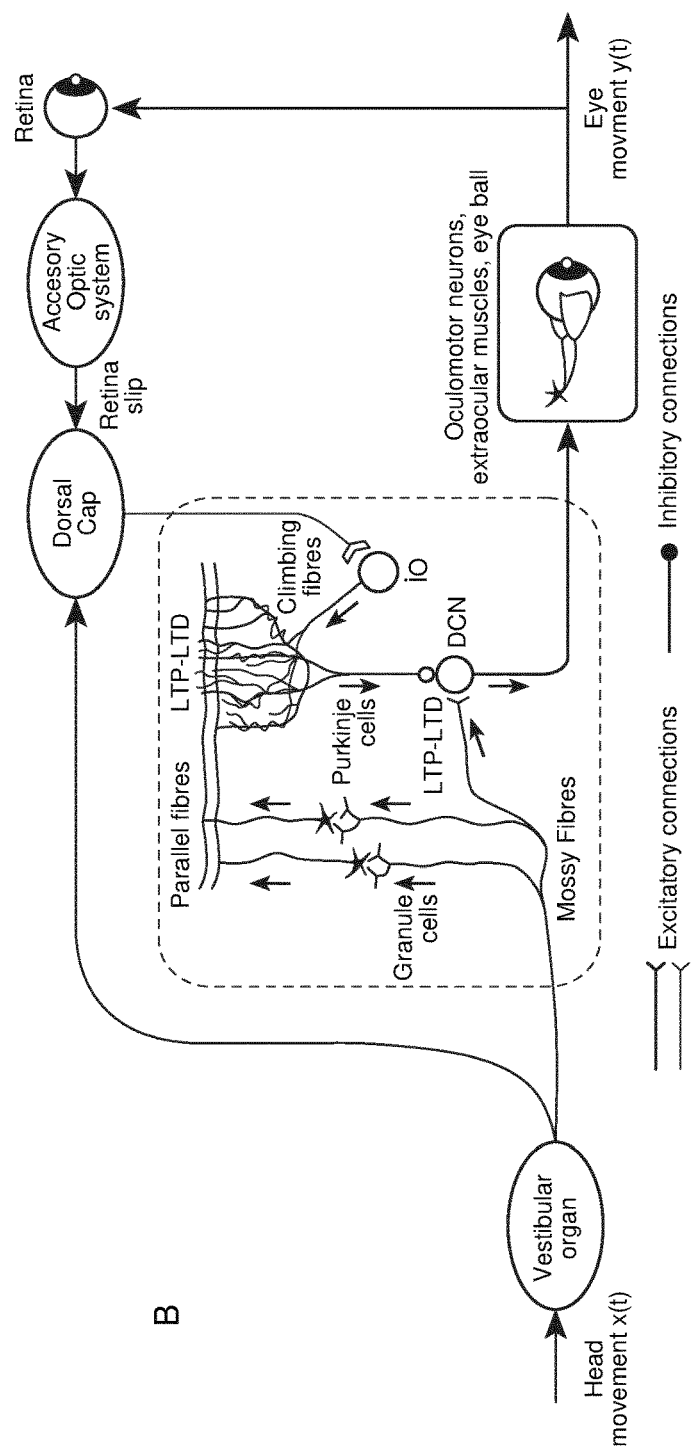
Figure 6:
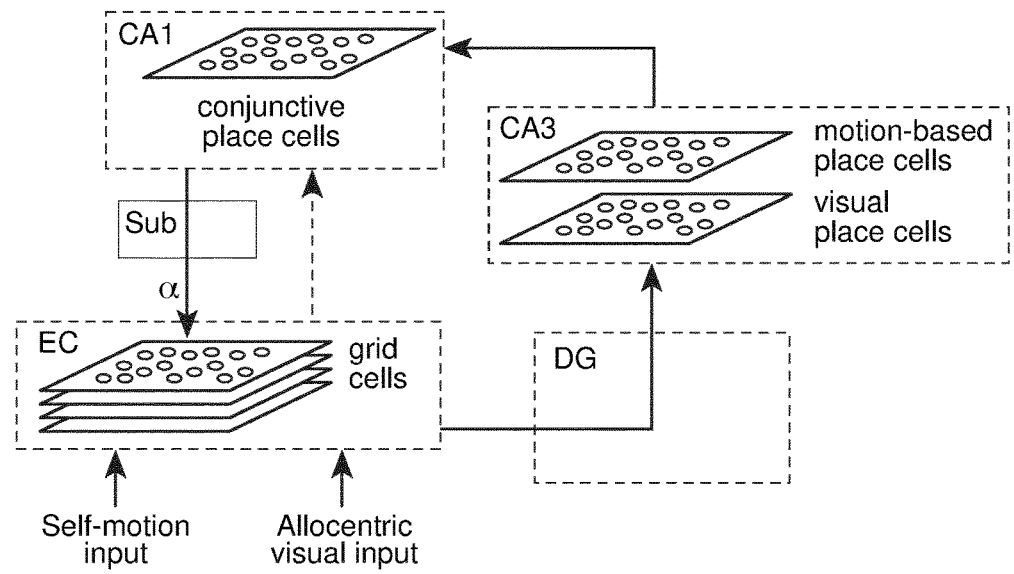
Figure 7:
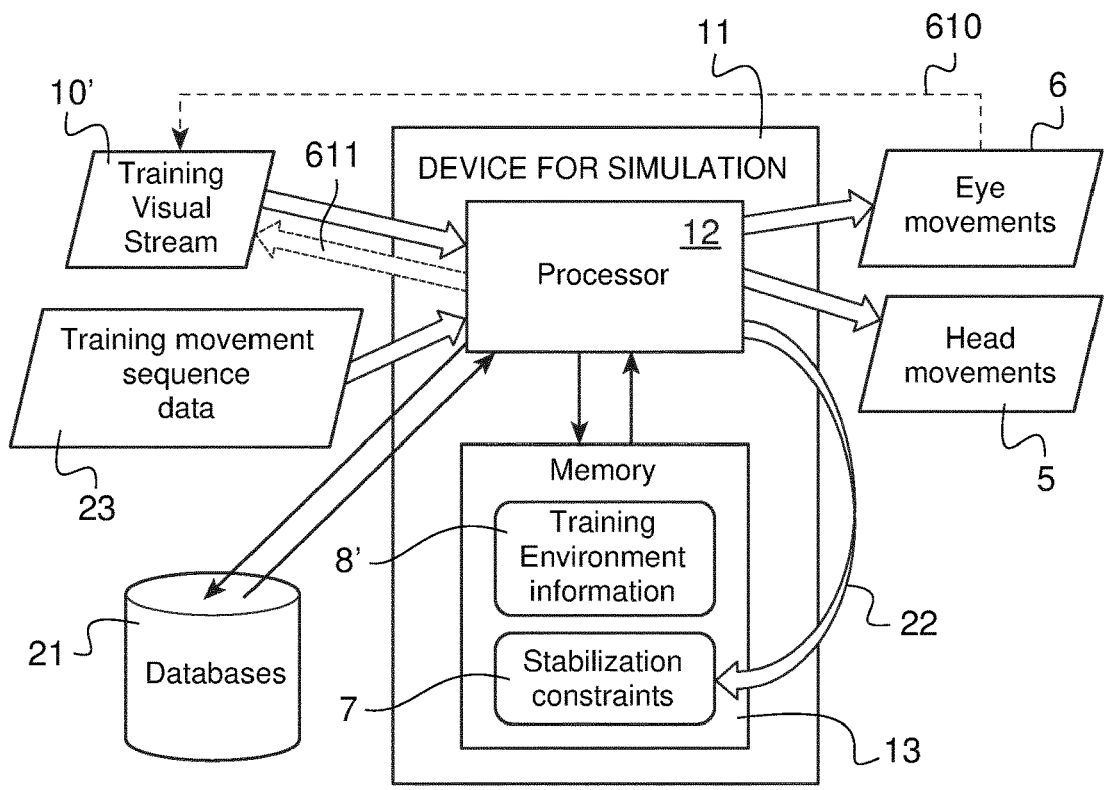
Figure 8:
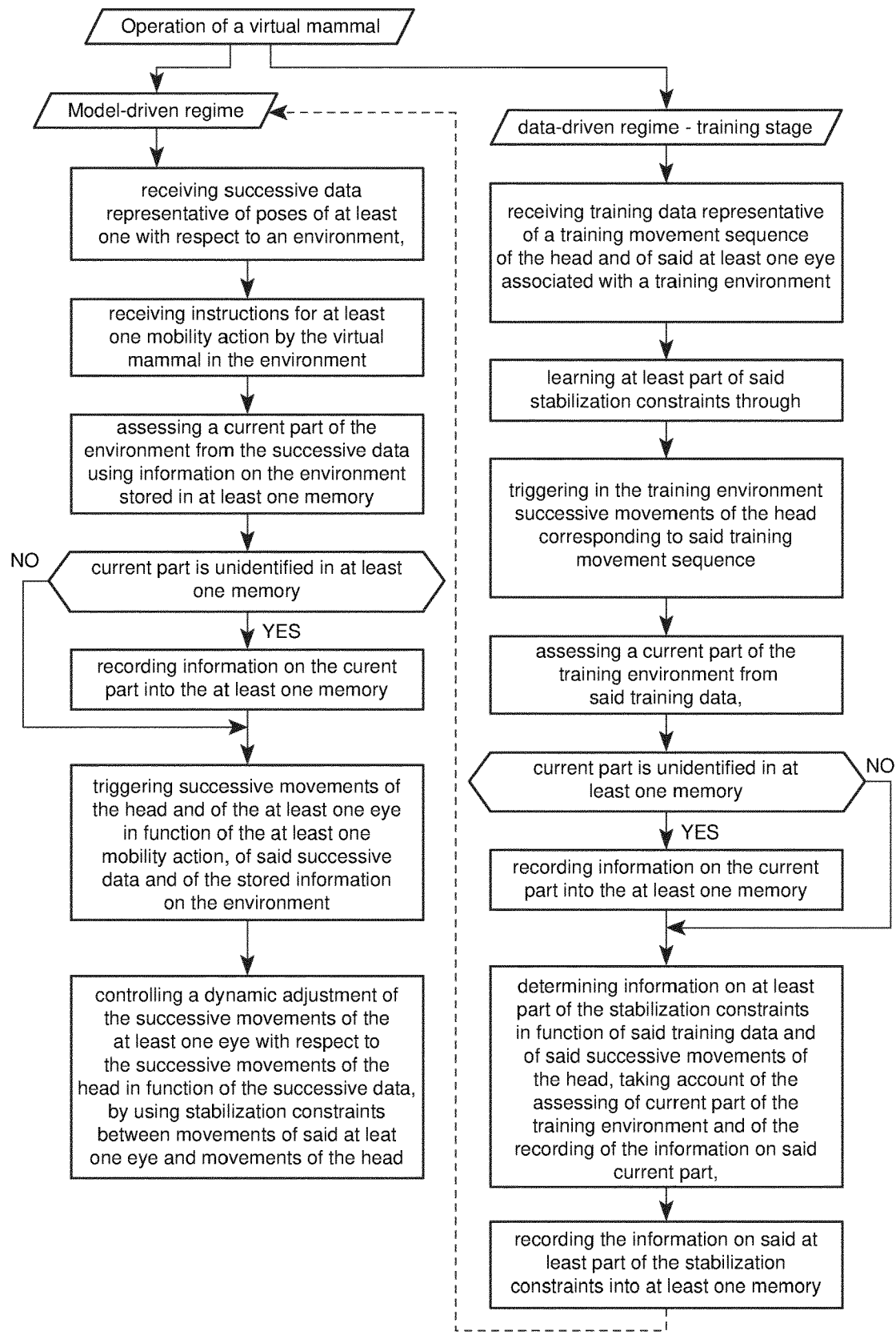

Embodiments of the present invention will now be described by way of examples only and with reference to the accompanying figures of which:

FIG. 1 illustrates symbolically the main structural, functional and environmental characteristics and relations of the virtual mammal simulated by the device according to the disclosure, FIG. 2 schematically illustrates the device that simulates the virtual mammal as operated in a model-driven regime, FIG. 3 schematically illustrates a preferred operative implementation of the data and functions of the device with functional modules, FIG. 4 illustrates an example of the different elements that may be considered for modelling/simulating the retina and the early visual cortex of the mammal, FIG. 5A illustrates an example of a mathematical model of the VOR controller that can be inferred from FIG. 5B that illustrates a simplified structure of the VOR neuronal system of the mammal and that is modelled/simulated, FIG. 6 illustrates a simplified Hippocampus neuronal structure of a mammal that is a basis for modelling/simulating the processing of visual and self-motion information during construction of internal spatial representation, FIG. 7 schematically illustrates the material elements of the device that simulates the virtual mammal as operated in a data-driven regime and FIG. 8 is a flowchart of the process of the disclosure.

The device and process of the disclosure are intended to simulate physiological behaviours of a mammal that can be in good health or bad health (it is then also possible to simulate pathological behaviours) of at least the vision system (we will see that additional functions and parts, organs may be easily added to the virtual mammal) of a mammal using a virtual mammal, the mammal being simulated in the device. Therefore, the simulated physiological behaviours are the ones from a mammal in good health or a mammal having some pathology(ies). The mammal that is referred to is preferably a human, particularly when the device is applied to the selection of a visual equipment, notably lenses or googles.

The vision system in the virtual mammal is simulated with a set of functions that are for example the functions related to the action of the eye on the light entering the eye (for example in relation to the curvature and length of the eye), the conversion of the light/photons in the retina, the different operations done on the converted light with a parallelism with the different neuronal structure functions of the vision system of the real mammal that is the reference for the virtual mammal. Those neuronal structure functions are for example the early visual processing structure, the vestibulo-ocular reflex (VOR) neuronal structures. Those functions, as concerns the ones involving neuronal structures in the real mammal, are most preferably implemented/executed as neuronal networks in the virtual mammal to simulate the real neuronal structure. However, in the case the function of the real neuronal structure is very simple and/or does not change much between mammals, it can be simulated more simply with a mathematical function and/or logic function that can be predetermined and fixed.

In the following explanations, we will consider a visual stream as the vehicle/support of the data representative of the poses (position +orientation). The visual stream corresponds to eye poses with respect to the environment and it may be received in the device or it may be determined by the device from known eye poses and from environment data (the latter not being the same as the information on the environment that may be stored in the memory/memories of the virtual mammal and which concerns the information as available to the mammal).

Moreover, the following explanations are mainly based for the control of the dynamic adjustment of the eye movements on the VOR mechanisms. It can further encompass separately or in combination stabilization related to intentional eye fixation and/or optokinetic reflex (in following a moving object). Accordingly, each one alone or combinations of those modes, VOR, intentional eye fixation and optokinetic reflex, can be implemented in the device (we will see that it/they can be implemented with corresponding functional modules). Preferably, the vestibulo-ocular reflex, VOR, is at least implemented for simulating the virtual mammal.

Referring to FIG. 1, the virtual mammal 1 simulated by the device 11 according to the disclosure is located in an environment 2 and has relations with it, in the current instance mainly visual relations that are in the form of a visual stream 10 of data corresponding to what is seen or supposed to be seen in the environment 2 by the eyes 4 of the virtual mammal and this corresponds to information contained in the received light/the photons. The eyes and parts of the vision system processes visual information contained in the visual stream 10 to get environment information 8.

The virtual mammal has a head 3 on which the eyes 4 are located and both the head 3 and the eyes 4 are mobile as symbolized with the rotating arrows 5, 6, the eyes being mobile 6 relative to the head and the head being mobile 5 relative to the environment 2. Those movements can be "voluntary" movement as opposed to reflex movements, the "voluntary" movements being under the control of mobility action instructions 9. The "voluntary" movements under the control of mobility action instructions 9 are for the "voluntary" mobility of the head 3 or also for the "voluntary" movements of the eyes 4 depending of the type of the mobility action instruction. The eyes 4 are also subjected to reflex movements depending of stabilisation constraints 7.

The virtual mammal can be totally virtual, or it can comprise some material elements and for example a material head that is mobile with material mobile eyes that are cameras, the whole being in a material environment, real and/or displayed on screens. The virtual mammal can also be virtually located in a totally virtual environment, notably when it is itself fully virtual. It can also comprise a body (totally virtual or having a material element) that may be also mobile in the environment. The virtual mammal can be implemented as a robot.

The material elements of the virtual mammal are in fact extensions of the simulated mammal. As regards outputs/responses, the simulated mammal also simulates the material elements and said simulation being used to control effectors that move or activate the material elements. The movements of the material elements are thus the result of the simulation and which comprises the response to voluntary or reflex movements notably through the mobility actions instructions. As regards inputs, notably the visual stream, it can be synthetic (i.e. created by a computer) or obtained from a camera, notably a camera at the location of the eye on a virtual mammal having material head and eyes. Of course, the simulated mammal can be extended with additional input and/or output items, means such as arms, legs, listening capabilities . . . and thus additional corresponding functional modules (see hereafter) are added.

The virtual mammal can thus be placed in a virtual environment, that can be a very detailed 3D model of a real environment and that can be used to reproduce recorded behaviour of a mammal notably a human, or a synthetic/imaginary 3D environment and that can be used to predict what a person on which the virtual mammal has been defined will do, if placed in similar real environment.

Now, FIG. 2 shows schematically the main hardware elements that are implemented in the device for simulating a behaviour related to vision of a mammal in an environment. This FIG. 2 is related to a device in which the virtual mammal is readily built from a model of the mammal and it is then referred as being implemented in a model-driven regime. The virtual mammal 1 is made of a device 11 for simulating the mammal. A processor 12 is at the heart of the device and it can be implemented in multiple ways. It can be a computer, typically a microcomputer, an array or network of computers, with at least one general purpose processor or a combination of general-purpose processor(s) and specialized processing means such as neuronal computing hardware or reprogrammable gate arrays. The processor 12 is under the control of a software and communicates with a memory 13 and through input-output links with its surroundings. The memory stores notably the environment information 8 and the stabilization constraints 7. Again, the memory can be of any type: generic circuits such as RAM, EEPROM . . . or specialized circuits, for example, in which information may be stored through the structure of the circuits as in material or simulated neuronal circuits.

The software under which the processor 12 is operated is configured to simulate a mammal and is configured to simulate and to control (through output links) the head movements 5 and the eye(s) movements 6 according to received (through input links) instructions for mobility actions 9 ("voluntary" mobility) and visual stream 10 and this includes the processing/generation by the processor 12 of "reflex" eye movements to adapt the eye(s) movements according to the stabilization constraints 7 and environment information 8.

A wide arrow 611 is represented in dashed lines on FIG. 2, between the processor 12 and the visual stream 10, and this symbolizes the fact that the processor 12 can modify, notably through pre-conditioning, the visual stream 10 it receives based on defined conditions, notably on simulated visual properties. Those conditions may be related to the effects of, for example, lenses or googles or of some parts of the eye on the light supposed to be received by and transmitted through the eye(s) to the retina of the virtual mammal. For example, those conditions may be the interposition of virtual lenses on the eye(s) of the virtual mammal (or real lenses on the material eyes of the virtual mammal), the presence of degenerative tissues in the eye(s), the effect of the age on the eye(s), the action of an eye surgeon removing part of the eye . . . For that purpose and to be able to select some of those conditions, a dedicated condition input links (not represented) may be added. Those conditions may also be part of the software controlling the processor 12.

On FIG. 2, a regular arrow 56 is represented in dashed lines between the resulting head movements 5 and eye movements 6 and this symbolises the "reflex" part of the movements of the eye(s) and that is due to the movements of the head. Another regular arrow 610 is represented in dashed lines between the resulting eye movements 6 and the visual stream 10 and this symbolises the fact that when the eye(s) move(s) relative to the environment, the information contained in the visual stream 10 changes because the eye(s) of the virtual mammal does not sight anymore in the same direction. When the virtual mammal comprises mobile eyes that are cameras, the change in the information in the visual stream 10 is automatic. But, if the eyes of the virtual mammal are also simulated, this could be the processor 12 that changes the information in the visual stream and this can be done through the output 611 discussed above.

The model-driven regime of the virtual mammal is mainly operated with instructions for mobility actions to get goal-oriented behaviours. In that model-driven regime, the virtual mammal can be used to implement a new behaviour. This model-driven regime can be used for prediction and monitoring.

Now, there are cases where it is not possible to determine a model from scratch to build the virtual mammal in a model-driven regime. Moreover, it is often more advantageous to build the virtual mammal from knowledge obtained on the real mammal (that can be a specific individual or a statistical one or a one corresponding to a group for example) to get a virtual mammal behaving identically to the real mammal, the behaviour of the virtual mammal being built from the behaviour of the real mammal through a learning process in a training stage of what is called a data-driven regime. The data-driven regime corresponds to a machine learning configuration of the device of the disclosure. Once the virtual mammal has been trained and has learnt the behaviour (i.e. it has been configured through learning to behave as the real mammal), it can be put in a model-driven regime.

Therefore, due to the data-driven regime and as represented on FIG. 7, the software of the device for simulating a mammal is also configured, in a training stage of the data-driven regime, to learn (symbolized with the arrow 22) the stabilization constraints 7 from data 23 representative of a training movement sequence of the head and of the eye(s) possibly associated with a determined training environment information. For that purpose, the processor 12 receives training movement sequence data 23 of the head and of the eye(s) and the training visual stream 10' while the virtual mammal is set in a determined training environment that can be stored in the memory in the form of a Training Environment information 8'. Databases 21 can exchange data with the processor 12. The databases can store parameters of the simulation, notably recorded experimental data, that can be loaded automatically in the device. We will see further on that the databases can store many other types of data, including predefined models to set directly the device in the model-driven regime without having to execute the data-driven regime and its training stage. They can also store the result of the simulation or the resulting model obtained from a training stage for reuse at a later time without having to redo a training stage at that later time.

In this data-driven regime represented on FIG. 7, the training movement sequence data 23 corresponds to applied eye movements and head movements and this is not and does not correspond to the instructions for mobility actions of the model-driven regime of FIG. 2.

The training movement sequence data 23 that is representative of a training movement sequence of the eye(s) associated with a training environment do not necessarily comprise eye movements. They can instead include a related input visual stream as observed by a real mammal, an "average" mammal or a fictive mammal in the training environment or other type of input visual stream for the training.

For example, the input visual stream was determined upstream from real eye movements tracked by an appropriate camera fixed on the mammal or external thereto, and from the surrounding environment and is provided as such to the device. The input visual stream was e.g. induced from gaze directions obtained from the tracked eye movements, through ray tracing in a virtual environment corresponding to the surrounding environment, or from moving one or two camera(s) in a way reflecting the tracked eye movements in the surrounding environment.

In another example, the input visual stream was obtained by averaging several visual streams associated to different real persons, for example belonging to a same group (e.g. same gender, similar age, similar eye disease, same height category . . . ). In still another example, the input visual stream was artificially created, e.g. based on a real-world visual stream which was later transformed.

Anyway, having eye movement information as training movement sequence data 23 is indeed a particularly interesting embodiment, the related training visual stream 10' being then determined by the device from received data on the training environment, by e.g. ray tracing associated with eye poses corresponding to the eye movement information and with a virtual environment corresponding to the training environment, as well known in the art.

In addition, the training movement sequence data 23 include head and eye movement data corresponding to a training movement sequence associated with a training environment. They usually take voluntary movements into account, since a training movement sequence usually integrates environment recognition, not only reflex eye movements. In this respect, the environment recognition process and the stabilization process may be closely intertwined and interdependent.

The mammal's eye movement stabilization properties are induced from a learning process. In this respect, head movements and visual stream, or head and eye movements together with data related to the training environment can be sufficient. Information on the stabilization constraints can in fact be derived from existing instabilities and stabilization effects in the obtained input visual stream, taking account of the head movements and of the ongoing environment recognition.

One can note the absence of an arrow in FIG. 7 (data-driven regime) between the eye movements 6 and the head movements 5 as opposed to FIG. 2 (model-driven regime) in which an arrow is present. Indeed, in the training stage, the eye movements and head movements are usually taken and applied simply as received, e.g. as previously monitored in a real-world situation. No consideration is usually made in this regime regarding their relationship, since they are merely taken together as entries and the absence of an arrow in FIG. 7 means that the relationship between the eye movements and the head movements does not matter in retrieving and applying those data in the training stage.

In addition to the training stage of the learning process of the data-driven regime, the virtual mammal can be set to reproduce an experimentally recorded behaviour to verify that the learnt configuration or the preestablished model works correctly. Moreover, in this data-driven regime, new data can be obtained and that go beyond available experimental data: for example, if the data of the position of the user's head in the environment, position of the eyes with respect to the head, gaze direction and visual field of the user can be experimentally measured, the virtual mammal simulation can in addition provide the information about the contents of visual field, visual cues on which the user fixates, and neural activity of, for example, retinal ganglion cells.

When the stabilization constraints 7 are learnt 22, the device leaves the training stage of the data-driven regime and can return to its regular operating state of the model-driven regime or stay in the data-driven regime but not in the training stage, for example, to reproduce an experimental behaviour data. In the training stage, the learning process is typically done through a deep learning process and/or any learning process that configures neuronal networks in case such an implementation is used. The use of a training movement sequence of the head and of the eye(s) for the learning corresponds to a data-driven regime in which the virtual mammal is asked to reproduce an experimentally recorded behaviour.

In other words, the training stage corresponds to the data-driven regime of the device in which the device learns to behave the same as the real mammal that is due to be the object of the simulation. The resulting virtual mammal after the training stage is an image of the mammal which served as a reference. The mammal which served as a reference for training the virtual mammal may be a real mammal or a statistical mammal (e.g. an average of real mammals) or even a constructed on-purpose mammal. The information that is dealt with in the context of the term "learning" refers implicitly to database information to be learn and that can be correlated with the information resulting from the operation of the device (movement sequence, possibly related mobility action, possibly induced visual stream in the training environment . . . ) with reference data related to mammal behaviour, by means of appropriate analysis tools; the database may in particular be available via libraries, whether local (user library) or remote (server library).

During the operation of the device, being in a learning stage or in a regular operating state, it is possible to access to the data that is processed in the device and also to access to the behaviour of the virtual mammal from material parts of it, e.g. head and/or eyes positions that are mobile. For example, it is possible to measure and/or record the position of the virtual mammal's material head in the environment, the position of the material eyes with respect to the head, the gaze direction and the visual field. In another way, notably when there is no material part of the virtual mammal and that it is necessary to rely on the data that is processed, it may be possible to get and/or compute the same information from processed data obtained from the device. Moreover, when the functions of the vision system are implemented/executed as simulated neuronal networks it is also possible to get detailed information on the structure of the simulated/virtual neurones obtained from a learning process and how they behave. It may also be possible to get information on how the visual stream is processed and "represented" within the vision system and to get information about the contents of visual field, visual cues on which the user fixates, and neural activity of e.g. retinal ganglion cells.

The software that controls the processor 12 has many functions and it is preferable to implement a modular system for the different functions, notably for ease of programming, maintenance, customization and upgrading, the upgrading comprising the addition of new function such as for example controlling the mobility of an added material body of the virtual mammal. In addition, with a modular system it is easier to create a system functionally closer to the real biological systems of the mammal that is simulated with the virtual mammal.

As regards upgrading, as far as the vision system is concerned and because the eyes are on the head of the virtual mammal, the movements of a complete body including walking can be resumed to the movement of the head in the space of the environment to simplify the processing. Indeed, as regards the vision system, it can be noted that the consideration of the movements of the head in the space can be enough for the simulation of a whole body as the head bears the eyes and the vestibular system.

In an upgraded implementation, the virtual mammal can have a complete body and be able to walk and/or do other movements of the body that may be controlled, as we will see, by specific functional modules. The walk and/or other movements cause, as a result, movements of the head that are taken into account by the functional modules that are directly related to the vision system.

The system can thus be easily extended by adding modules that implement additional functions: each functional module simulates a biological organ or a brain area or a part of it (e.g. eyes, retina and visual cortex, hippocampus; cerebellum; musculoskeletal system and control areas in the brain that control balance and posture of the virtual mammal). Each function can be implemented by several functional modules at different level of biological detail. To speed up simulation, some functional modules can be implemented by fast algorithms, whereas others by a detailed biological simulation involving neural networks or cellular models.

FIG. 3 is an exemplary modular system with a communication means on which different components such as functional modules, processing means, ancillary tools and data structures are interconnected. This modular system with those components is under the control of a control program that is part of the software of the device. More precisely, in this example: server libraries component 14, user libraries and analysis tools 15, 3D aging virtual mammal and its environment component 16 and three functional modules 17, 18, 19 are connected to a message passing middleware 20. The three functional modules that are represented are: virtual retina & early visual cortex module 17, Cerebellar VOR control module 18 and Hippocampus module 19.

The 3D aging virtual mammal and its environment component 16 mentions the word "aging" because it has been developed to consider the age of the virtual mammal, the capacities and functions simulated by the device evolving with the age of the virtual mammal.

The server libraries component 14 manages components (registration, subscription, interfacing, broadcasting). The 3D component 16 is a specific client module that performs visualization, using a 3D simulation environment, of the virtual mammal, its environment and chosen behaviour. The user libraries and analysis tools component 15 (including analysis and Graphic User Interface) implements the control and analysis of the simulation platform and its main functions include:

the configuration of the virtual mammal parameters (either manually or loaded from a file or learnt).

the configuration of the virtual mammal environment that can, for example, be loaded from a file.

the configuration of the virtual mammal behaviour in relation to functional modules. User can for example load experimental data that determine user behaviour. In the data-driven regime in which a learning process is executed, the behaviour is determined by the experimental data, for example, the position of head and direction of gaze as a function of time. In the model-driven regime, the behaviour is determined by an experimental protocol, which describes a behavioural task (e.g., in a navigation experiment, a start position, and a goal must be given, as well as the number of learning trials).

access to any specific data analysis tools developed to process and visualize the outcome of a simulation. These analysis tools may concern a particular component of the virtual mammal, an assessment of its behavioural performance, etc.

When the functional modules and the virtual environment are known, it is possible to efficiently parametrize the virtual mammal of the device. Parameters of the model can be separated on global parameters that affect all or most of the functional modules and components (such as, e.g. age, gender, specific pathology, etc.) and on local parameters that affect behaviour of specific functional modules or component (e.g. visual acuity or contrast sensitivity, or any other experimentally measured parameter of the mammal).

The message-passing middleware 20 is the backbone of the system that permits each component connected to the system to send messages to other components and to call functions implemented on the other components. From the engineering perspective, the implementation of the device can be done through a distributed system, that can be run on one computer, on several computers or on computer cluster, depending on the number of modules and their complexity.

As mentioned previously, other components may be added that may be functional modules including computational models of a specific brain area (e.g. the primary visual cortex) or a biological organ (e.g. the eye). Each functional module must be registered in the system, can subscribe to messages of other modules, and must publish its own functions.

For the implementation of the Message-passing middleware 20, an open-source ROS framework (http://www.ros.org) may be used. In particular, a development of this framework using C/C++language and called cROS (https://github.com/rrcarrillo/cros) may be used. This development includes the ROS master, the server module that manages the components using standardized software interfaces, and implements message passing/broadcasting and remote function calls. In a biologically plausible implementation of functional modules, these modules exchange messages represented by spike trains, i.e. sequences of short events that simulate electrical action potentials that are used by neurons in the nervous system to exchange information. For this purpose, a special type of messages has been compiled into the ROS library, such that any module can send to any other module a spike trains in an asynchronous manner, modelling information transmission in the brain. The system can also be extended by adding other custom message types.

The 3D aging virtual mammal and its environment component 16 may be developed using "Unity 3D engine" (https://unity3d.com/unity). The "Unity 3D engine" offers many functionalities that can be used to model realistic 3D environments, including lighting effects, physics, animation. The full control of the engine can be performed using programming language C#. This functionality is used to remotely control the 3D model from the User Libraries & analysing tools 15 component. The subcomponent of the User Libraries that implements control of the 3D aging virtual mammal and its environment 16 component is referred to as control program in this document.

Five generic C#scripts are used to control the 3D aging virtual mammal and its environment 16 component:

RosInterface. This script implements the ROS interface, so that the 3D aging virtual mammal and its environment component can exchange messages with other modules, including the control program, from which the 3D aging virtual mammal and its environment component is remotely controlled.

SimulationManager. This script is called by the control program and it is responsible for managing the state of the simulation. It is used to create the virtual mammal and its environment, as well as start, pause and stop the simulation of behaviour.

SubjectMovement. This script implements the behaviour of the virtual mammal, as commanded from the control program. This script also receives raw sensory data from the virtual mammal sensors (e.g. it receives the flow of visual information of the visual stream, experienced by the virtual mammal). This sensory information is passed back to a control script, or to any other module that is subscribed to receive it via subscription service of the server libraries component.

SubjectEye. This script implements an eye of the virtual mammal and it can be simulated by a video camera attached to the virtual mammal's head.

PALens. This script performs the distortion of the visual input due any visual equipment such as single vision, lenses/googles, filter, photochromic, etc. attached to the virtual mammal's eyes. This is that script that is doing the pre-conditioning of the visual stream.

Thus, the 3D aging virtual mammal and its environment component 16 is used to visualize the virtual mammal, its environment and its behaviour. In this example, this component also serves to simulate visual distortion effects due to visual equipment, such as lenses/googles.

Concerning the visualization of the virtual mammal's environment, any detailed 3D model of the environment created by a specialized software (such as AutoCAD®) can be loaded as environment model. In another implementation, a 3D model of a real experimental room can be developed directly in "Unity 3D engine".

The visualization of the virtual mammal head and body and more generally its physical appearance and of the movements thereof can be implemented using MakeHuman software (http://www.makehumancommunity.org) when it is of the human type. The Virtual mammal may be a customizable 3D model of a generic human person in the case the simulated mammal is a human. In the current implementation, the customization of the visual appearance includes, age, gender and outlook. However, any detailed 3D human model (e.g. created by a specialized software) can be loaded.

The User Libraries & Analysis tools 15 component allows the user to:

Load virtual mammal parameters from a parameter file or from an experimental database.

Create, start and stop simulations, while in regular operating state or in training stage, using a control program written, for example, in Matlab or Python.

Obtain simulation data generated by any Module of the platform, notably by subscribing to messages from the corresponding module, and analyse this data so as to provide performance assessment, monitoring and prediction.

We are now describing some of the functional modules that can be used and more specifically the ones in relation to the vision system and to eye adaptation to head movement. The functional modules considered are the ones represented in FIG. 3 and that have been implemented in relation to the different functions of the real mammal brain as regard its vision system and eye adaptation to head movements.

The Virtual retina & early visual cortex module 17 is a functional module that simulates the activity of retinal ganglion cells in the mammal, notably human, retina. That functional module is based on the elements represented in FIG. 4. That module can also be applied to simulate orientation-sensitive neurons in V1-V2 areas of brain. As input, that module receives the visual stream from a virtual mammal's eye or from a camera of a material eye of the virtual mammal. As output, that module generates spike trains (sequences of simulated action potentials) emitted by simulated retinal ganglion cells. Retinal processing is simulated in a detailed manner as a cascade of customizable spatio-temporal filters applied to the retinal input visual stream. Parameters of this model, such as properties of spatio-temporal filters can be predetermined or learnt and thus adjusted to retinal recording data (usually it is done with an extracted retina on a dish with measuring electrodes, so that the retinal activity could be recorded). In particular, age-related changes in early visual processing can be taken into account on this model by parameterizing the virtual retinal model.

The cerebellar VOR control module 18 is a reflexive eye movement that stabilises the images on the retina during head rotations by contralateral eye movements for the purpose of maintaining the image in the centre of the visual field. The VOR is mediated by a brain area in which adaptation is directly driven by sensorimotor errors: the cerebellum. The cerebellar VOR control module 18 may implement a detailed model of VOR control by neuronal networks in the cerebellum as based on the neuronal structure represented in FIG. 5B. In a more simplistic implementation, the cerebellar VOR control module 18 may be implemented based on the controller model represented in FIG. 5A as a mathematical function.

The Hippocampus module 19 is based on a neuronal model of the hippocampus and it is involved in the construction of the neural representation of the environment of the virtual mammal. This neuronal model is derived from the representation of the FIG. 6. Vision-based spatial navigation in mammals is controlled by the neuronal networks of the brain area called the hippocampal formation. Several types of neurons in this brain area, notably place cells and grid cells, interact in an intricate manner in order to construct, on the basis of incoming sensory inputs, a neural representation of surrounding environment. As represented FIG. 6, Self motion input and Allocentric visual input are input in an array EC of grid cells and processed information is directed through other arrays of neuronal cells: DG, CA3 with visual place cells and motion-based place cells, CA1 with conjunctive place cells, for a feed-back (Sub α). The Hippocampus module 19 simulates with neuronal networks the operation of the hippocampal formation during spatial assessment of the environment by the hippocampal formation.

The Hippocampus module 19 receives as input, a plurality of information:
the visual information as outputted by the virtual retina & early visual cortex module 17 that received the visual stream,
other sensory information such as proprioceptive, vestibular.

The Hippocampus module 19 generates as output, activities of neurons that encode the location of the virtual mammal in the environment. These outputs can then be used to drive goal-oriented behaviour of the virtual mammal in a model-driven regime.

The virtual mammal of the device is capable of assessing a current part of the environment from the visual stream it receives and is also capable of recording information on said current part into its memory and this recording can be considered as some kind of learning/training. One can therefore consider that the device has a double training scale: one level directed to configuring the virtual mammal for the dynamic eye movement adjustment in the data-driven regime with its training stage, and another level directed to learning the environment in the data-driven as well as in the model-driven stage; said otherwise, the data-driven stage involves the combined double training scale.

As regards the two possible regimes of the device, the data-driven regime can run after the model-driven regime was already applied, notably for re-configuring a virtual mammal (e.g. consideration of another individual, health state modification or ageing of a same individual . . . ); at any rate, it precedes the model-driven regime based thereon, and is preliminary to this extent.

In the data-driven regime, movements of the virtual mammal in the environment are performed based on commands issued from the control program.

In an implementation, the control commands include a set of recorded spatial coordinates of body parts (e.g. provided by motion capture equipment) as a function of time, that the virtual mammal has to replay. In order to run smoothly the visualisation, the control movements are interpolated to provide the basis for the final virtual mammal animation, which is created by blending a standard set of five basic animations.

As regards the movements of the different parts of the virtual mammal, the control program provides also gaze direction data, which is used to control the eyes of the virtual mammal. In an implementation, the spatial coordinates of the gaze target in the 3D environment are provided as a function of time. In order to make the movements of the virtual mammal head compatible with the movements of the virtual mammal eyes, inverse kinematics approach is used. Inverse kinematics equations determine the joint eye-head positions that are compatible with the data and with the constraints of the virtual mammal's 3D model. Additional parameters such as eye's wavefront, pupil diameter and eyelid movement (acquired with an eye tracker) can be added to improve the accuracy of the simulation. The gaze direction data and the additional parameters can also be used in the training stage for the learning of the stabilization constraints.

In the model-driven regime, the control program provides the experimental protocol of the behavioural task to perform. In this case the virtual mammal's movements are controlled by an additional functional module that implements a brain area that executes movement control. In fact, movement control can be implemented in many ways. For example, a specific module for movement control, i.e. a movement control module, can be added to the modular system. In another implementation and that correspond to the modular system of FIG. 3, with the VOR adaptation, the Cerebellar VOR control module 18 implements adaptation of eye movement by directly controlling the position of the eye for the 3D aging Virtual mammal component 16.

In another implementation, an additional functional module, i.e. a model of eye muscles module controlled by spiking output of the Cerebellum VOR control module 18, can be added to the modular system and that implements eye control in a very detailed and physiological plausible manner. In the same way but on a larger scale, the Hippocampus module 19 in the implementation of FIG. 3 can also directly control the movements of the virtual mammal itself if it is built to move, by simply setting the direction and speed of motion of the virtual mammal. Instead, one can add a specific locomotion module to the modular system that implements motor control of the virtual mammal in a physiological plausible manner.

The same interpolation algorithms are used to implement natural-like behaviour of the Virtual mammal.

An example of simulation in a model-driven regime is the following:

1. First, the mammal subject that is the object of the simulation has its behaviour recorded during some experimental task to produce recorded data. For example, adaptation to a new visual equipment is recorded by measuring the dynamics of the eye movements across several trials in defined environment(s).

2. The virtual mammal is then simulated in the data-driven regime to learn the model parameters of at least one function module involved in the eye adaptation movements, in this example the cerebellar VOR control module with its stabilization constraints, and that is/are based on neural networks. For that purpose, the virtual mammal that is now in the training stage, is simulated with the recorded data obtained previously and with the same corresponding environment(s). When the functional model is trained, notably that the stabilization constraints are set, it represents a model of how this particular subject adapts to the new visual equipment.

3. After the functional module has been trained at step 2, it can be used to predict how the subject will adapt to another visual equipment, that has never been tested before or, possibly, to the same as a mean to check the quality of the model. In this model-driven simulation, the virtual mammal parameters, notably the stabilization constraints in this example, are thus fixed and a new visual equipment is installed on the virtual mammal. The simulation is then started and the performance of the virtual mammal is recorded. This performance constitutes a prediction of what the subject will do if this new visual equipment is put on him in this particular task.

More generally, the same sequence of data acquisition (to get recorded data and related environment from the mammal that is to be simulated), model-training (learning process in a training stage of the virtual mammal operation) and model-based prediction can be used with any functional module. For example, the Cerebellar VOR control module 18 can be trained on recorded data to predict how the subject will adapt to new experimental conditions. As another example, the Hippocampus module 19 can be trained through a learning process on a real navigation task in some environment. In a model-driven regime, the virtual mammal can be used to predict what will happen if the same navigation task is performed in another environment. Any module that can express adaptation and learning can be trained and then used for prediction.

As concerns more particularly the vision system that is simulated in the virtual mammal, the mammal eye is simulated as a virtual (the virtual mammal has no material part simulating an eye) or real (the virtual mammal has a material part simulating an eye and that comprises a camera) cylindric camera.

In addition, or as an alternative, any detailed model of mammal, notably human, eye can be used. This can for example be implemented by a modified SubjectEye C#script to implement desired calculations directly by the 3D aging virtual mammal module. If model complexity is high and requires a dedicated processing, a new functional module could be implemented and that may run on a separate computer or a computer cluster, and that will process the visual stream and publish it for the other functional modules using the Message passing middleware.

Similarly, to the virtual mammal's eyes, any visual equipment can be modelled, either by directly implementing it with C#script directly in the 3D aging virtual mammal module, or by using a dedicated functional module. It is possible to simulate a visual distortion and/or to add some aberration (on the wavefront) to the lenses of the eyes and to calculate the effect on the retinal image. It is then possible to evaluate the impact of an astigmatism and of high-order aberrations on subjective best focus on the virtual mammal.

The implementation of a virtual mammal with the modular system can be done according to the following way:
1-Definition of the virtual mammal based on the mammal that will be simulated. The definition contains parameters about the mammal profile. It takes into account demographic information such as age and/or gender and/or other information. As an example of other information, in the context of ophthalmic use, parameters such as at least prescription, fitting parameters can be considered but also sensory, motor and cognitive state information. The definition content will depend of the objectives of the simulation and the context. The definition can be entered in many ways: manually, with a file containing relevant parameters or even learned in a training stage. In this definition, the objectives and a problem to solve with the device for simulating the virtual mammal are also set. The objectives and the problem can be related to any domain, industry, medical, gaming and comprises at least:
   Learning in the training stage, to set the parameters such as the stabilization constraints through a learning process
   Replay/Render movements with the virtual mammal as a result of learning,
   Assessment or Monitoring of the movements or of other elements (for example, representation of visual information in a part of a modelled (neural network) vision structure) or, more generally, of data (notably stabilization constraints, quality of vision . . . ) and/or structures (notably structures and characteristics of neural networks) involved in the processing in the device.
   Predicting movements or other elements.
2-Functional module selection. Selection of the regime (model-driven or data-driven regime) and modules is done according to the objectives of the user.
3The output/response of the simulation with the 3D virtual mammal can be delivered for one specific user or for a cluster of users. The output/response can be delivered from the different functional modules and/or further processed to get assessments of behaviour such as navigation, autonomy as well as at sensorial, motor or/and brain levels.
4-Determination/selection/optimisation of solutions to a problem to which the virtual mammal is confronted. This is a neuro-computational based method/process to determine or select, objectively or subjectively, any problem involving the simulation, replay, a visual equipment lens; or to provide personalized recommendations for improving mammal's health. The impact of visual equipment or re-education/re-habilitating can be simulated and tested in a virtual environment modelling the mammal performances. Thanks to a software modelling, aging mammal behaviour can be simulated or replayed for predicting the impact of potential visual processing (e.g. eye disease), human brain, behaviour deficits, or poor vision (e.g. uncorrected or unfit refraction). In a standalone version, the virtual mammal includes an auto-evaluation mode in order to compare the outputs/responses of the virtual mammal. This standalone version provides criterion for establishing recommendation on the best solutions.

The applications of the device of the disclosure are numerous.

In a first application, it can be used for the selection of a new lenses/googles by assessing its impact on the locomotion of the simulated mammal. In this first application the device simulates the distortion caused by the lenses/googles on the visual stream coming to the retina. The motion of a real mammal is recorded using a Motion and Eye-Tracking system during exploration of a real environment. The data recorded by the system consists of spatial coordinates of each of sensor, plus eye-tracking data. These data are loaded into the device during a training stage via the control program in order to control movements and gaze direction of the Virtual mammal for learning in the data-driven regime. After the training stage, the learned virtual mammal is made, through simulation, to wear the lenses/googles, whose distortion by the visual input is modelled using the PALens script in the 3D aging Virtual mammal component 16. By means of User Libraries & Analysis tools component 15, the visual input with and without lenses/googles can be compared with each other during exploration of a simulated real-world environment. In particular, visual distortions can cause changes in balance and locomotion patterns. Thus, by analysing changes in visual input due to the visual equipment, and linking these changes to postural control balance, sway, walking speed, it is possible to adjust properties of visual equipment to minimize the impact on the performances.

In this first application of the device of the disclosure, it can be used to select an ophthalmic solution adapted for the daily behaviour of a wearer such as mobility, navigation activities, among a database of existing ophthalmic solutions. The definition of the human virtual mammal includes wearer profile (prescription, age, fitting parameters . . . ). For example, the parameters in the definition of the virtual mammal can be: individual aged 65 years old with a prescription change need, current lenses are with a short length of progression. The environment is a commercial environment. The inputs parameters are an ophthalmic solution database containing available visual equipment and data recording of body movements recorded during a simplified navigation task in the commercial environment. For the functional modules and components selection, as the virtual mammal wears different visual equipment, their distortions on the visual stream input is modelled using PALens script in 3D Aging virtual mammal and its environment component. By means of User Libraries and Analysis tools component 15, the minimum configuration of the involved modules and components is:

For data-driven regime, 3D aging virtual mammal and its environment component 16 with its PALens script for the computation of visual environment distortion, and the Cerebellar VOR control module 18.

For model-driven regime, 3D aging virtual mammal and its environment and functional Modules including the Cerebellar VOR control Module 18 for recomputing the eye movements based on the cerebellar VOR control module 18 and head movements recorded with the current lens. Indeed, a wearer adapted to his/her lenses distortions will present an optimal simulated vestibulo-ocular reflex (VOR) to stabilise the image on the retina.

As regards the virtual mammal outputs/responses, in a data-driven regime, output/response parameters will be the amount of distortions computed from the recorded locomotor pattern, eye movements and simulated commercial environment. Document WO2017157760A1 can be referred as a method to perform the selection of the visual equipment minimizing the lens distortion on the retinal visual stream.

As regards the virtual mammal outputs/responses, in a model-driven regime, this gives rise to supplementary assessment by inverted engineering method. A wearer having a prescription of addition change from +2.50 to +3.00 dp will face to new visual motions due to distortion and will need to adapt his/her vestibulo-ocular reflex (VOR) response. The sensorimotor error produced by the new visual equipment distortions will be computed by using the functional module Cerebellar VOR control module 18 and Virtual retina & early visual cortex module 17 as well as the PALens script of the 3D Aging virtual mammal and its environment component 16.

For the determination/selection/optimisation of the visual equipment or intervention solutions, the user of the device will select the new lens among the available existing design with a +3.00 dp of addition giving rise to the minimum of sensorimotor error of the vestibulo-ocular reflex (VOR) response compared with the current visual equipment of the wearer with +2.50. Any person skilled in the art knows that visual equipment distortions on the temporal side of the lens are stronger with a short design, or to present a "soft" or "hard" lens design. However, the current approach defined the hardness of the lens from an optical computation of the local rate of the variation of the unwanted astigmatism and associated optical deviation (local prismatic effect) of the lens. This variation can be more or less steep and complex. However, the distortions of a lens are created by multiple factors such as: the fitting parameter, the optical design as well as the eye-head pattern of a wearer while moving. At a new approach, the model-driven regime gives the opportunity to the user of the device to have a wearer approach in assessing the vestibulo-ocular reflex (VOR) mechanism produced by the locomotor and eye movement patterns of each wearer. Personalized selection will be done among the database of available lenses in comparing the current visual equipment distortion, with all visual equipment tested on the wearer.

In a second application of the device of the disclosure, a new visual equipment can be designed using a vestibulo-ocular reflex (VOR) time adaptation aging effect as a performance criteria during a conception phase. The conception phase is a manual or automatic modification of the lens parameters, such as power and unwanted astigmatism repartition, front and rear surfaces definition, etc. In this application, an age effect on the vestibulo-ocular reflex (VOR) adaptation experiment is simulated.

First, standard parameters of a young human mammal are used to configure the virtual mammal. For the configuration, the device of the virtual mammal is trained with a learning process, in a training stage, with data obtained on a young mammal doing at least sinusoidal rotations of the head in the horizontal plane and using a determined environment. During the experiment with the virtual mammal of the device, sinusoidal rotations of the head of the virtual mammal in the horizontal plane are induced using the same environment. During this experiment with the virtual mammal, the Cerebellar VOR control module 18 automatically adjusts the control of "eye muscles" of the virtual mammal to counteract the sinusoidal movement of its head by opposite movements of the eye of the virtual mammal. The vestibulo-ocular reflex (VOR) adaptation based on image slipping on retina is assessed by the analysis of the dynamics of eye movements of the virtual mammal: the amplitude of eye movements due to a poor stabilization must decrease with time. The time scale of the adaptation is the measured variable.

The same operations are then performed with an aged virtual mammal, in which age-induced changes on the vestibulo-ocular reflex (VOR) adaptation performance has been configured. These age-induced changes result in a decreased speed in vestibulo-ocular reflex (VOR) adaptation dynamics, that can be analysed by the User Libraries & Analysis tools 15 component. As regards the vestibulo-ocular reflex (VOR) adaptation and if needed it can be referred to "Adaptation to Telescopic Spectacles: Vestibulo-ocular Reflex Plasticity", Demer et al, 1989 IOVS and to "Effect of adaptation to telescopic spectacles on the initial human horizontal vestibulo-ocular reflex." https://doi.org/10.1152/jn.2000.83.1.38.

Practically, regime model selection is based on available data and wearer parameters. The wearer profile (prescription, age, fitting parameters . . . ) can be a young ametrope and a presbyopic 40-50 years old or a presbyopic 40-50 years old or a presbyopic 60-70 years old or a presbyopic 70-80 years old. The environment is defined. One can use behavioural data (in data-driven regime) or task to perform (in model-driven regime).

In the model-driven regime, a new visual equipment will be designed in estimating the impact of this new design on the criteria defined by the vestibulo-ocular reflex (VOR) time adaptation through the age, based on standard parameters of a young mammal used to configure through learning in the training stage the virtual mammal.

Again, input data are standard parameters of a young mammal and are used to configure the virtual mammal and for that purpose sinusoidal rotations of the head of the virtual mammal in the horizontal plane are induced.

A functional module and component selection is made. The virtual mammal wears lenses/googles, whose distortion on the visual stream is modelled using PALens script in 3D aging virtual mammal and its environment 16 component. By the means of the User Libraries & Analysis tools 15 component, the minimum defined configuration of the involved functional modules and components is:

For data-driven regime: 3D aging virtual mammal and its environment 16 component with the PALens script, the Virtual retina & early visual cortex module 17.

For data-driven regime: 3D aging virtual mammal and its environment 16 component, the Virtual retina & early visual cortex module 17, the Cerebellar VOR control module 18.

As regards the virtual mammal outputs/responses, the residual retinal slipping and time scale of the adaptation output parameters are computed for all age groups as the age-induced changes result. The speed of the vestibulo-ocular reflex (VOR) adaptation and residual retinal slipping is identified per age group.

As regards the determination, selection, optimisation of the visual equipment or the choice of intervention solutions, multifactorial optimisation will consist in identifying the design parameters of the visual equipment such as astigmatism, magnification, length progression . . . that will reduce the time cost adaptation of the vestibulo-ocular reflex (VOR) and residual retinal slipping in taking into account the amplitude and velocity of the eye movements per age group.

In a third application of the device of the disclosure, one can assess the influence of visual equipment on the ability of a mammal to estimate its own motion trajectory from the visual stream 10. The motion of a real mammal is recorded using a Motion and Eye-Tracking system during a navigation task (either in a real environment or in a virtual environment with head-mounted display), in which the mammal follows a predefined trajectory from a starting position (e.g. two sides of a triangular trajectory) and is then required to return back to the unmarked starting position. The task is repeated over several trials. Returning to the starting position requires estimating own position with respect to the start and is known to depend on the neuronal processing in the Hippocampus. The accuracy of own position estimation is determined from the errors made by subjects when returning to the starting position.

In virtual environments, several different types of visual input can be simulated to assess lens distortion depending on the statistics of surrounding visual cues. The same task in the absence of visual input permits the estimation of self-position based only on proprioceptive input (as vision-independent control condition). The recorded data consists of spatial coordinates of each sensor and eye-tracking data. A virtual mammal including Virtual retina 17, VOR control 18 and Hippocampus module 19 is created. The data are loaded into the device during a training stage via the control program in order to control movements and gaze direction of the Virtual mammal for learning in the data-driven regime. As a result of learning, neural networks of the Hippocampus module 19 will acquire a representation of location with the accuracy adjusted to the accuracy of the real mammal.

The visual distortion is introduced in the model-driven regime via simulated visual equipment using the PALens script in the 3D aging virtual mammal module. The influence of visual distortion introduced by the lens on the performance in the task is analysed by means of User Libraries & Analysis tools component 15. Apart from testing the influence of distortions introduced by lens, one can test the changes in task performance associated with progressing age, or with progressing visual disease. In particular, given several longitudinal measures of healthy or pathological mammal's visual system (e.g. its retinal state, useful visual field, light diffusion in the eye, etc.), one can build a model of age-related or disease-related changes in visual processing over time. This model can be loaded into the Virtual mammal and then used to predict the state of the visual system of the mammal in near future. With such an aging virtual mammal model, one can simulate the behaviour of the mammal (and its adaptation to novel environmental conditions, or to the new visual equipment) in future and provide potential rehabilitation solutions or propose new visual equipment to counteract age- or disease-related troubles.

FIG. 8 that is a flowchart of the process of the operation of the virtual mammal of the disclosure, shows the two possible ways of operating the virtual mammal: a model-driven regime and a data-driven regime, this last regime being operated in the learning stage for learning information of at least part of the stabilization constraints.

In the data-driven regime, the steps are:

receiving training data representative of a training movement sequence of the head and of said at least one eye associated with a training environment learning at least part of said stabilization constraints through:

triggering in the training environment successive movements of the head corresponding to said training movement sequence, assessing a current part of the training environment from said training data, testing if the current part is unidentified in at least one memory if not, recording information on the current part into the at least one memory, determining information on at least part of the stabilization constraints in function of said training data and of said successive movements of the head, taking account of the assessing of current part of the training environment and of the recording of the information on said current part, and recording the information on said at least part of the stabilization constraints into at least one memory.

At the end of those steps, at least part of the stabilization constraints are recorded and can be used in a model-driven regime and this is symbolized by the discontinued arrow from the last step of the data-driven regime to the model-driven regime.

In the model-driven regime in which the stabilization constraints are present in the device (learnt through a previous data-driven regime or gained through another means), the steps are:

receiving successive data representative of poses of at least one eye with respect to an environment, receiving instructions for at least one mobility action by the virtual mammal in the environment, assessing a current part of the environment from the successive data using information on the environment stored in at least one memory, testing if the current part is unidentified in at least one memory, If not, recording information on the current part into the at least one memory, triggering successive movements of the head and of the at least one eye in function of the at least one mobility action, of said successive data and of the stored information on the environment, controlling a dynamic adjustment of the successive movements of the at least one eye with respect to the successive movements of the head in function of the successive data, by using stabilization constraints between movements of said at least one eye and movements of the head.

The invention claimed is:

1. A virtual mammal device for simulating a physiological behavior corresponding to a vision system of a virtual mammal in a visual environment, said virtual mammal including: a head mobile with respect to the environment, and at least one eye rotationally mobile with respect to the head, said device comprising:
  at least one first input adapted to receive successive data representative of poses of said at least one eye with respect to the environment;
  at least one second input adapted to receive instructions for at least one mobility action by the virtual mammal in an environment;
  at least one memory adapted to store information on the environment and on stabilization constraints between movements of said at least one eye and the head, said stabilization constraints corresponding to at least one of: a vestibulo-ocular reflex, an intentional eye fixation, and an optokinetic reflex; and
  a computer having at least one processor, the at least one processor of the computer configured to:
    assess a current part of the environment from said successive data,
    record information on said current part into said at least one memory if said current part is unidentified in said at least one memory,
    trigger successive movements of the head and said at least one eye as a function of said at least one mobility action, said successive data and the stored information on the environment, and
    control a dynamic adjustment of the successive movements of the at least one eye with respect to the successive movements of the head as a function of said successive data and the stabilization constraints,
  wherein said device further comprises: at least one third input adapted to receive in a training stage training movement sequence data representative of a training movement sequence of the head and said at least one eye associated with a training environment, and
  said at least one processor is further configured to learn, during said training stage, at least part of said stabilization constraints through:
    triggering in the training environment successive movements of the head corresponding to said training movement sequence data,
    assessing a current part of the training environment from said training data, and recording information on said current part into said at least one memory if said current part is unidentified in said at least one memory,
    determining information on said at least part of the stabilization constraints as a function of said training data, said successive movements of the head, said current part of the training environment and said information on said current part, and
    recording said information on said at least part of the stabilization constraints into said at least one memory,
  so that the behavior of the virtual mammal executing said at least one mobility action can be simulated,
  wherein a modular system implemented via the at least one processor includes: functional modules, processing circuitry, ancillary tools, and data structures that are interconnected through a message passing middleware,
  wherein the virtual mammal device is implemented as a robot via material parts including a structural head, a camera being at least one eye, and effectors that enable movement or activation of the material parts of the virtual mammal device,
  wherein said at least one processor further comprises at least one first neural network configured to provide said dynamic adjustment through a feedback loop,
  wherein said at least one processor is further configured to:
    obtain at least one visual stream corresponding to said successive data representative of poses of said at least one eye, assess said current part of the environment from said at least one visual stream,
    trigger said successive movements, and
    control said dynamic adjustment as a function of said at least one visual stream, and
  in said training stage,
    obtain at least one training visual stream corresponding to said training movement sequence data representative of the training movement sequence, and
    assess said current part of the training environment and determine said information as a function of said at least one training visual stream, and
  said device further comprising at least one fourth input adapted to receive at least one simulated visual property,
  wherein said at least one processor is further configured for dynamically pre-conditioning said at least one visual stream as a function of said at least one simulated visual property, and
  wherein said at least one simulated visual property is at least partly pertaining to a physiological behavior associated with said at least one eye or to a visual equipment of said at least one eye.

2. The device according to claim 1, wherein said at least one processor is further configured to:
  simulate at least one working parameter proper to said virtual mammal, and
  learn, during the training stage, said at least one working parameter in as a function of said training data and of said successive movements of the head, said current part of the training environment and said information on said current part.

3. The device according to claim 1, wherein said at least one processor is further configured to
  pre-condition said obtained at least one visual stream and said at least one training visual stream, in association with at least one pre-conditioning parameter proper to said mammal to simulate, and learn, during the training stage, said at least one preconditioning parameter as a function of said at least one training visual stream, said successive movements, said current part of the training environment and said information on said current part.

4. The device according to claim 1, wherein said at least one processor is further configured to:
derive successive images from said at least one visual stream and
control said dynamic adjustment by stabilizing at least part of said derived successive images.

5. The device according to claim 1, wherein the device comprises at least one fifth input adapted to receive information on modified values of the stabilization constraints, said at least one processor is further configured to update the information regarding previous values of the stabilization constraints in the memory with the information regarding said modified values.

6. The device according to claim 5, wherein said previous and modified values of the stabilization constraints include at least one of age or a health state of a mammal.

7. The device according to claim 1, wherein said at least one processor comprises at least one second neural network configured to assess said current part of the environment and recording the information on said current part.

8. The device according to claim 1, wherein said at least one processor is configured to carry out at least one operation including: assessing said current part of the environment, recording said information on said current part, and controlling the dynamic adjustment of the successive movements of said at least one eye, by way of simulated spiking neurons.

9. The device according to claim 1, further comprises at least one input adapted to receive information on modified values of the stabilization constraints, said at least one processor being configured for updating the information regarding previous values of the stabilization constraints in the memory with the information regarding said modified values.

10. A method implemented in a virtual mammal for simulating a physiological behavior corresponding to a vision system of a virtual mammal in a visual environment, said virtual mammal being implemented to include: a head rendered mobile with respect to the environment, and at least one eye rendered rotationally mobile with respect to the head, said method comprising:
receiving successive data representative of poses of said at least one eye with respect to the environment,
receiving instructions for at least one mobility action by the virtual mammal in the environment,
assessing, by at least one processor, a current part of the environment from said successive data using information on the environment stored in at least one memory, and recording information on said current part into said at least one memory if said current part is unidentified in said at least one memory,
triggering, by said at least one processor, successive movements of the head and said at least one eye as a function of said at least one mobility action, said successive data and the stored information on the environment,
controlling, by said at least one processor, a dynamic adjustment of the successive movements of said at least one eye with respect to the successive movements of the head as a function of said successive data, and stabilization constraints between movements of said at least one eye and movements of the head, wherein said stabilization constraints corresponding to at least one of: a vestibulo-ocular reflex, an intentional eye fixation, and an optokinetic reflex, said method further comprises:
receiving, during a training stage, training data representative of a training movement sequence of the head and said at least one eye associated with a training environment, and
learning, by said at least one processor, in said training stage, at least part of said stabilization constraints through:
triggering in the training environment successive movements of the head corresponding to said training movement sequence,
assessing a current part of the training environment from said training data, and recording information on said current part into said at least one memory if said current part is unidentified in said at least one memory,
determining information on said at least part of the stabilization constraints as a function of said training data and said successive movements of the head, said current part of the training environment and said information on said current part, and
recording said information on said at least part of the stabilization constraints into said at least one memory,
so that the behavior of the virtual mammal executing said at least one mobility action can be simulated,
implementing said at least one processor as further comprising at least one first neural network configured to provide said dynamic adjustment through a feedback loop, and
further configuring said at least one processor to:
obtain at least one visual stream corresponding to said successive data representative of poses of said at least one eye,
assess said current part of the environment from said at least one visual stream,
trigger said successive movements and control said dynamic adjustment as a function of said at least one visual stream,
in said training stage, obtain at least one training visual stream corresponding to said training movement sequence data representative of the training movement sequence, and assess said current part of the training environment and determine said information as a function of said at least one training visual stream,
implementing at least one input adapted to receive at least one simulated visual property, and said at least one processor being further configured for dynamically pre-conditioning said at least one visual stream as a function of said at least one simulated visual property, wherein said at least one simulated visual property being at least partly pertaining to a physiological behavior associated with said at least one eye or a visual equipment of said at least one eye,
wherein a modular system implemented via the processor includes: functional modules, processing circuitry, ancillary tools and data structures that are interconnected through a message passing middleware, and
wherein the virtual mammal is implemented as a robot via material parts including: a structural head, a camera being the at least one eye and effectors that enable movement or activation of the material parts of the virtual mammal.

11. A non-transitory computer readable medium having stored thereon a computer program comprising instructions which, when the program is executed by a processor, causes said processor to carry out the processes of claim 10.

12. The method according to claim 10, wherein said at least one processor is further configured to carry out at least one operation including: assessing said current part of the environment, recording said information on said current part, and controlling the dynamic adjustment of the successive movements of said at least one eye, by way of simulated spiking neurons.

* * * * *